(12) United States Patent
Kaindl et al.

(10) Patent No.: US 11,374,125 B2
(45) Date of Patent: Jun. 28, 2022

(54) VERTICAL TRANSISTOR DEVICE HAVING A DISCHARGE REGION COMPRISING AT LEAST ONE LOWER DOSE SECTION AND LOCATED AT LEAST PARTIALLY BELOW A GATE ELECTRODE PAD

(71) Applicant: Infineon Technologies Austria AG, Villach (AT)

(72) Inventors: Winfried Kaindl, Unterhaching (DE); Gabor Mezoesi, Villach (AT); Enrique Vecino Vazquez, Munich (DE)

(73) Assignee: Infineon Technologies Austria AG, Villach (AT)

( * ) Notice: Subject to any disclaimer, the term of this patent is extended or adjusted under 35 U.S.C. 154(b) by 161 days.

(21) Appl. No.: 16/823,510

(22) Filed: Mar. 19, 2020

(65) Prior Publication Data

US 2020/0312998 A1    Oct. 1, 2020

(30) Foreign Application Priority Data

Mar. 25, 2019   (EP) .................................... 19164882

(51) Int. Cl.
| | | |
|---|---|---|
| *H01L 29/78* | (2006.01) | |
| *H01L 29/06* | (2006.01) | |
| *H01L 29/417* | (2006.01) | |
| *H01L 29/423* | (2006.01) | |

(52) U.S. Cl.
CPC ...... *H01L 29/7827* (2013.01); *H01L 29/0615* (2013.01); *H01L 29/0653* (2013.01); *H01L 29/41758* (2013.01); *H01L 29/4238* (2013.01); *H01L 29/7811* (2013.01)

(58) Field of Classification Search
CPC ............. H01L 29/0615; H01L 29/4238; H01L 29/7827
See application file for complete search history.

(56) References Cited

U.S. PATENT DOCUMENTS

| | | | |
|---|---|---|---|
| 7,709,931 B2* | 5/2010 | Torii | H01L 29/7811 257/586 |
| 8,836,028 B2* | 9/2014 | Yedinak | H01L 29/7811 257/341 |
| 2011/0210392 A1 | 9/2011 | Nakata et al. | |
| 2016/0379992 A1* | 12/2016 | Nagao | H01L 29/7397 257/77 |
| 2017/0154992 A1* | 6/2017 | Willmeroth | H01L 29/42372 |
| 2017/0263755 A1 | 9/2017 | Kudou et al. | |
| 2017/0373140 A1 | 12/2017 | Hirler et al. | |

* cited by examiner

*Primary Examiner* — Anh D Mai
(74) *Attorney, Agent, or Firm* — Murphy, Bilak & Homiller, PLLC

(57) ABSTRACT

A transistor device includes transistor cells each having source and drift regions of a first doping type and a body region of a second doping type in a first region of a semiconductor body, and a gate electrode dielectrically insulated from the body region. A gate conductor arranged on top of a second region of the semiconductor body is electrically connected to each gate electrode. A source conductor arranged on top of the first region is connected to each source and body region. A discharging region of the second doping type is arranged in the second region and located at least partially below the gate conductor, and includes at least one lower dose section in which a doping dose is lower than a minimum doping dose in other sections of the discharging region. The at least one lower dose section is associated with a corner of the gate conductor.

15 Claims, 6 Drawing Sheets

D-D

VERTICAL TRANSISTOR DEVICE HAVING A DISCHARGE REGION COMPRISING AT LEAST ONE LOWER DOSE SECTION AND LOCATED AT LEAST PARTIALLY BELOW A GATE ELECTRODE PAD

TECHNICAL FIELD

This disclosure relates in general to a transistor device, in particular a vertical field-effect controlled transistor device.

BACKGROUND

Vertical field-effect controlled transistor devices, such as vertical MOSFETs (Metal Oxide Semiconductor Field-Effect Transistors) are widely used as electronic switches in various kinds of electronic circuits, such as power converters, drive circuits for various kinds of loads, or the like.

A vertical transistor device includes a plurality of transistor cells in a first region (active region) of a semiconductor body. Each transistor cell includes a source region of a first doping type (conductivity type), a body region of a second doping type complementary to the first doping type, a drift region of the first doping type, and a drain region of the first doping type, wherein the source region and the drain region of each transistor cell are spaced apart from each other in a vertical direction of the semiconductor body. Further, each transistor includes a gate electrode that is dielectrically insulated from the body region by a gate dielectric. The transistor device can be implemented as a superjunction transistor device. In this case, each transistor cell further includes a compensation region of the second doping type adjacent to the drift region.

The gate electrodes of the transistor cells are electrically connected to a gate conductor, wherein the gate conductor may be arranged on top of a second region (inactive region) of the semiconductor body. The source regions and the body regions may be connected to a source conductor formed on top of the first region of the semiconductor body. The second region is devoid of transistor cells. More specifically, the second region is devoid of body and source regions, but may include one or more drift regions and optional compensation regions. Further, the drain regions of the transistor cells may be formed by one semiconductor region that is formed in the first region and the second region of the semiconductor body.

A field-effect controlled transistor device can be operated in one of three different operating modes, a first gate-controlled operating mode, a second gate-controlled operating mode, and a diode-mode. In the gate-controlled operating modes, a polarity of a voltage between the drain region and the source conductor is such that pn-junctions that are formed between the body regions and the drift regions are reverse biased. (a) In the first gate-controlled operating mode a voltage between the gate conductor and the source conductor is such that conducting channels are formed in the body regions of the transistor cells, so that the transistor device is in a gate controlled on-state. (b) In the second gate-controlled operating mode the voltage between the gate conductor and the source conductor is such that conducting channels in the body regions of the transistor cells are interrupted, so that the transistor device is in an off-state. (c) In the diode mode, a polarity of the voltage between the drain region and the source conductor is reversed as compared to the gate-controlled operating modes and, therefore, such that the pn-junctions between the body regions and the drift regions are forward biased. The transistor device is in a bipolar conducting state in this operating mode.

In the bipolar conducting state, the drain region injects charge carriers of the first conductivity type and the body regions (and optional compensation regions) inject charge carriers of the second conductivity type into the drift regions, wherein these charge carriers form a charge carrier plasma in the active region as well as in the inactive region of the semiconductor body. When the transistor device changes from the bipolar conducting state to the off-state these charge carriers have to be removed before the transistor is capable of blocking a voltage between drain region and the source regions. In a transient phase from the bipolar conducting state to the off-state, the charge carriers of the first conductivity type, in the active region and in the inactive region, flow to the drain region. In the active region, the charge carriers of the second conductivity type flow to the body regions. Referring to the above, the inactive region is devoid of body regions. Thus, in the inactive region, second type charge carriers tend to flow towards a surface of the semiconductor body and, from there, in a lateral direction of the semiconductor body flow towards the active region.

There is a need to design the transistor device such that these second type charge carriers are removed from the inactive region in a fast and efficient way when the transistor device changes from the bipolar conducting state to the off-state.

SUMMARY

One example relates to a transistor device. The transistor device includes a plurality of transistor cells each including a source region of a first doping type, a body region of a second doping type, and a drift region of a first doping type in a first region of a semiconductor body, and a gate electrode that is dielectrically insulated from the body region by a gate dielectric; a gate conductor arranged on top of a second region of the semiconductor body and electrically connected to the gate electrode of each of the plurality of transistor cells; a source conductor arranged on top of the first region of the semiconductor body and connected to the source region and body regions of each of the plurality of transistor cells; and a discharging region of the second doping type arranged in the semiconductor body in the second region and located at least partially below the gate conductor. The discharging region includes at least one lower dose section in which a doping dose is lower than a minimum doping dose in other sections of the discharging region, wherein the at least one lower dose section is associated with a corner of the gate conductor.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
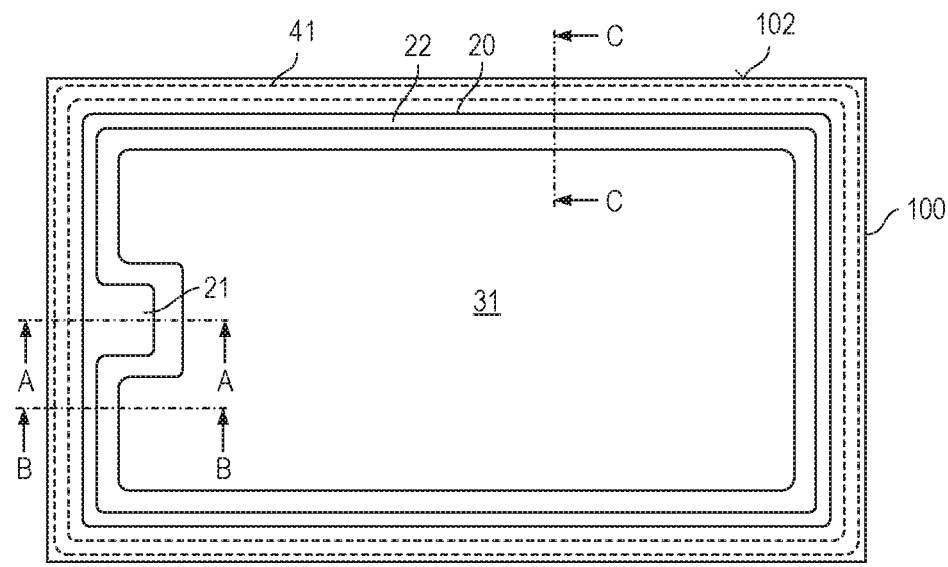
FIG. 1 schematically illustrates a top view of a vertical transistor device that includes an active region below a source conductor and an inactive region below a gate conductor.

FIG. 1 shows a top view of a vertical transistor device according to one example. More specifically, FIG. 1 shows a top view of a semiconductor body 100 in which active device regions of the vertical transistor device are integrated. Referring to FIG. 1, the transistor device includes a source conductor 31 and a gate conductor 20. Each of the source conductor 31 and the gate conductor 20 is arranged on top of a first surface of the semiconductor body 100, wherein the source conductor 31 is arranged above a first region of the semiconductor body 100, and the gate conductor 20 is arranged above a second region of the semiconductor body 100. The first region is also referred to as active region and the second region is also referred to as inactive region of the semiconductor body 100 in the following. Details of the active region and the inactive region are explained in further detail below. The gate conductor 20 is electrically insulated from the source conductor 31 and is spaced apart from the source conductor 31 in lateral directions of the semiconductor body 100. "Lateral directions" are directions parallel to the first surface on top of which the source conductor 31 and the gate conductor 20 are arranged.

Referring to FIG. 1, the gate conductor 20 includes a gate pad section 21 and a gate ring section 22. The gate ring section 22 adjoins the gate pad section 21 and, according to one example, surrounds the source conductor 31. The source conductor 31 and the gate conductor 20 include an electrically conducting material such as copper (Cu), aluminum (Al), titanium (Ti), or the like.

Optionally, the transistor device further includes a field ring 41 (illustrated in dashed lines in FIG. 1). This field ring is arranged on top of the first surface of the semiconductor body 100 and located between an edge surface 102 of the semiconductor body 100 and the gate conductor 20. The field ring 41 may completely surround the arrangement with the gate conductor 20 and the source conductor 31.

The semiconductor body 100 can be arranged (packaged) in an integrated circuit package such as a molding compound. Such package, however, is not shown in FIG. 1. Further, the source conductor 31 may be connected by bond wires, flat conductors, or the like, to one or more terminals protruding from the package. Equivalently, the gate conductor 20 may be connected to one or more terminals protruding from the package. However, such terminals and connections between the terminals and the source conductor 31 and the gate conductor 20 are not illustrated in FIG. 1.

In the example shown in FIG. 1, the semiconductor body 100 is essentially rectangular and the gate pad section 21 of the gate conductor 20 is arranged essentially at a position that is in the middle of one of four sides of the rectangular semiconductor body 100. This, however, is only an example. According to another example illustrated in FIG. 2, the gate pad section 21 is arranged in one of four corners of the rectangular semiconductor body 100.

Figure 2:
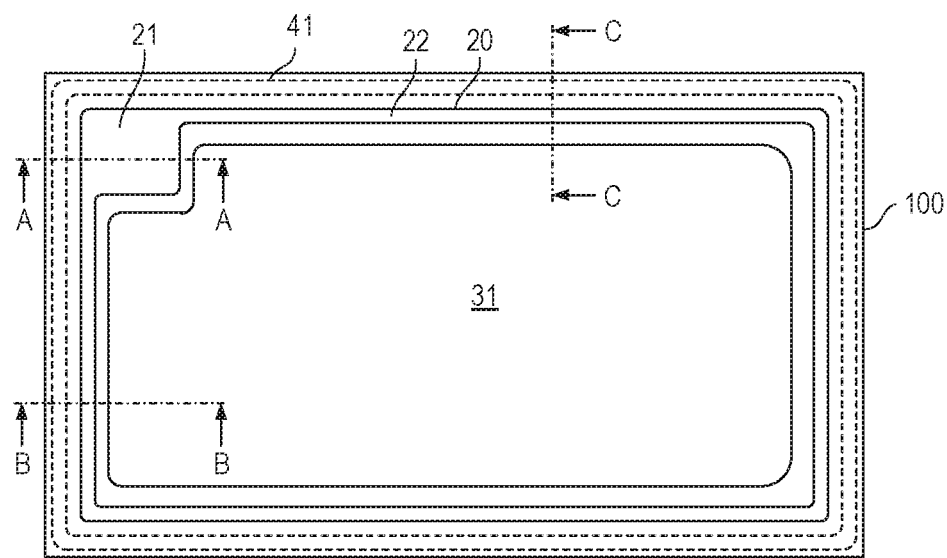
FIG. 2 shows a modification of the transistor device shown in FIG. 1.
Figure 3A:
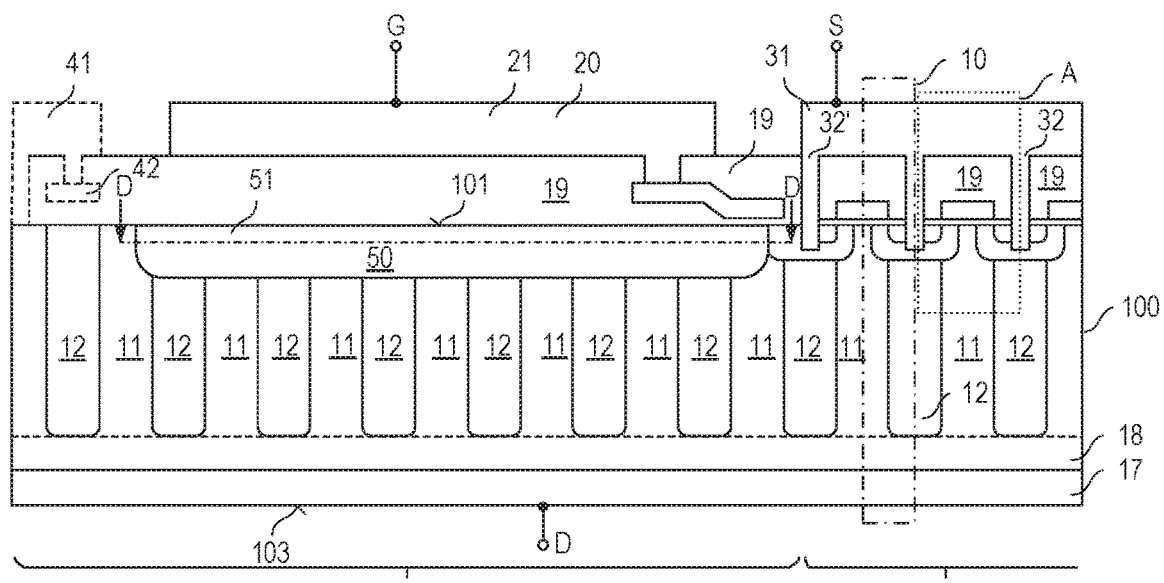
FIGS. 3A and 3B illustrate vertical cross-sectional views of one of the transistor devices shown in FIGS. 1 and 2 at different positions.
Figure 3B:
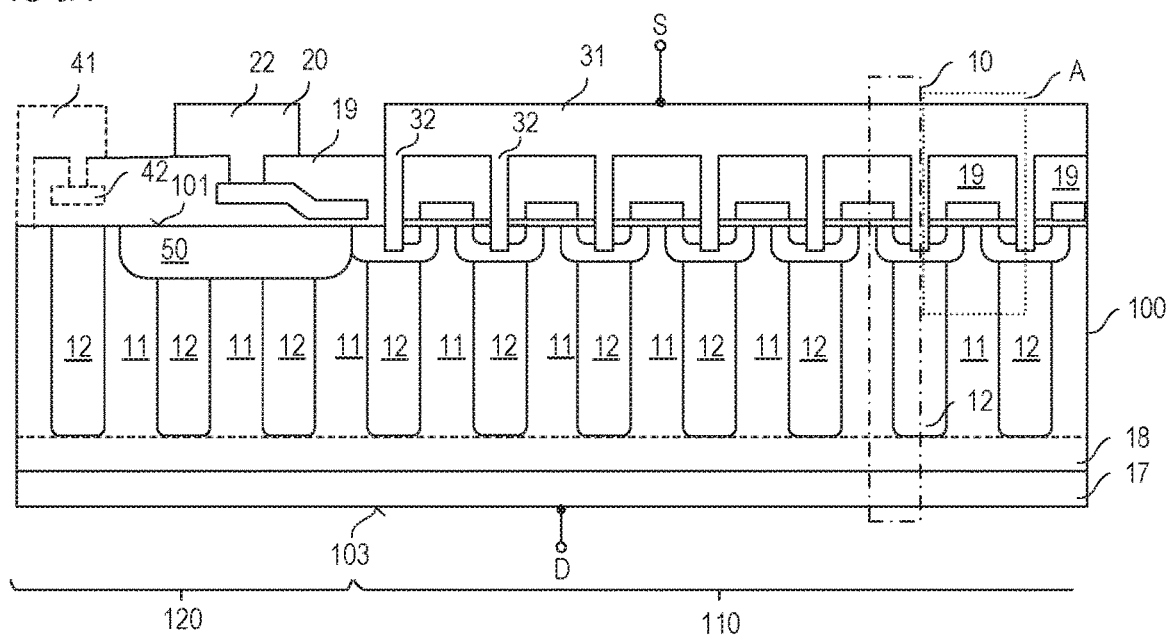

FIG. 3A shows one example of a vertical cross sectional view of the transistor device in a first section plane A-A shown in FIGS. 1 and 2 and FIG. 3B shows one example of a vertical cross sectional view of the transistor device in a second section plane B-B shown in FIGS. 1 and 2. The first section plane A-A cuts through the gate pad section 21, a section of the source conductor 31 and the semiconductor body 100 below the gate pad section 21 and the source conductor 31. The second section plane B-B cuts through the gate ring section 22 of the gate conductor 20, a section of the source conductor 31 and the semiconductor body 100 below the gate ring section 22 and the source conductor 31.

In FIGS. 3A and 3B, reference number 101 denotes the first surface of the semiconductor body 100, and reference number 103 denotes a second surface opposite the first surface 101. The second surface 103 is spaced apart from the first surface 101 in a vertical direction of the semiconductor body 100. Directions perpendicular to the vertical direction are referred to as lateral directions of the semiconductor body 100.

According to one example, the semiconductor body 100 includes a monocrystalline semiconductor material. Examples of the monocrystalline semiconductor material include, but are not restricted to, silicon (Si), silicon carbide (SiC), gallium arsenide (GaAs), gallium nitride (GaN), or the like.

Figure 3C:
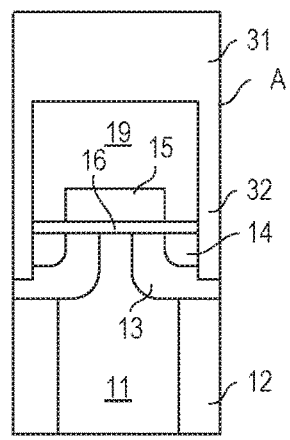
FIG. 3C shows a detail of FIGS. 3A and 3B.

Referring to FIGS. 3A-3C (wherein FIG. 3C shows a detail "A" shown in FIGS. 3A and 3B), the transistor device includes a plurality of transistor cells 10. Each of these transistor cells 10 includes active device regions in the active region 110 of the semiconductor body 100. The active device regions of each transistor cell 10 include a drift region 11 of a first doping type, a body region 13 of the second doping type and a source region 14 of the first doping type, wherein the body region 13 is arranged between the source region 14 and the drift region 11 so that the source region 14 is separated from the drift region 11 by the body region 13. Optionally, each transistor includes a compensation region 12 of the second doping type. The compensation region 12 adjoins the drift region 11 and, according to one example, adjoins the body region 13. Referring to FIGS. 3A and 3B, the active device regions of each transistor cell 10 further include a drain region 17. The drain region 17 may adjoin each of the drift region 11 and the compensation region 12. Optionally, as illustrated in dashed lines in FIG. 1, a buffer region 18 of the first doping type may be arranged between the drain region 17 and the drift region 11 and the compensation region 12. The buffer region may have the same doping concentration as the drift regions 11 or may have a higher doping concentration than the drift regions 11.

According to one example, the semiconductor body 100 includes monocrystalline silicon and the individual active device regions are implemented such that a respective doping concentration is in a range as outlined in the following: drift region 11: between $1E15\ cm^{-3}$ and $1E17\ cm^{-3}$; compensation region 12: between $1E15\ cm^{-3}$ and $1E17\ cm^{-3}$; body region 13: between $1E17\ cm^{-3}$ and $1E18\ cm^{-3}$; source region 14: between $1E18\ cm^{-3}$ and $1E21\ cm^{-3}$; drain region 17: between $1E18\ cm^{-3}$ and $1E21\ cm^{-3}$; optional buffer region 18: between $1E15\ cm^{-3}$ and $1E18\ cm^{-3}$.

Referring to FIGS. 3A and 3B, the drain regions 17 of each of the plurality of transistor cells 10 can be formed by one contiguous semiconductor region, which is referred to as drain region of the transistor device in the following. Further, the drift regions 11 of two neighboring transistor cells 10 can be formed by one contiguous semiconductor region of the first doping type, and the compensation regions 12 of two (other) transistor cells 10 can be formed by a contiguous semiconductor region of the second doping type.

Referring to FIG. 3B, each transistor cell further includes a gate electrode 15 that is arranged adjacent the body region 13 and that is dielectrically insulated from the body region 13 by a gate dielectric 16. The gate electrode 15 serves to control a conducting channel in the body region 13 between the source region 14 and the drift region 11. The gate electrodes 15 of the individual transistor cells 10 are connected to the gate conductor 20 which forms a gate node G of the transistor device. Further, the source and body regions 14, 13 of the individual transistor cells 10 are connected to the source conductor 31. Referring to FIGS. 3A and 3B, the source conductor 31 may be arranged on top of an insulation layer 19 that electrically insulates the source conductor 31 from the gate electrodes 15. Electrically conducting vias 32 extend from the source conductor 31 through the insulation layer 19 down to the source and body regions 14, 13 and electrically connect the source and body regions 14, 13 to the source conductor 31. The source conductor 31 forms a source node S of the transistor device. Further, the drain region 17 is connected to a drain node D of the transistor device or forms a drain node D of the transistor device.

Referring to the above, the gate electrodes of the individual transistor cells 10 are connected to the gate conductor 20. According to one example, the gate electrodes 15 of the individual transistor cells 10 are formed by a planar electrode that is formed on top of the first surface 101 of the semiconductor body 100. In lateral directions, this electrode extends beyond the active region 110 to below the gate conductor 20 and is electrically connected to the gate conductor 20.

Figure 4A:
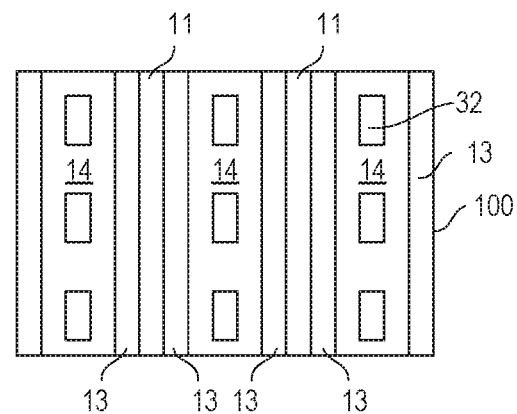
FIG. 4A shows one example of a horizontal cross-sectional view of one section of the transistor device shown in FIGS. 3A and 3B in a first section plane.

FIG. 4A shows a horizontal cross-sectional view of a section of several transistor cells 10 in a first horizontal section plane that cuts through the source regions 14 and the body regions 13 of the transistor cells. Referring to FIG. 4A, the transistor cells can be elongated transistor cells, so that the body and source regions 13, 14, the drift regions 11, and the optional compensation regions 12 are elongated regions. The source and body region 14, 13 of one transistor cell 10 may be connected to the source conductor 31 by several vias 32 that are spaced apart from each other in longitudinal directions of the transistor cell 10, so that the vias 32 do not intersect the planar electrode that forms the gate electrodes 15 of the transistor cells into separate sections.

Figure 4B:
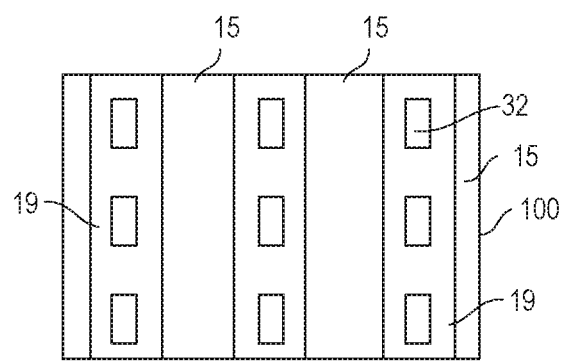
FIG. 4B shows a horizontal cross-sectional view of one section of the transistor device shown in FIGS. 3A and 3B in a second section plane.
Figure 6A:
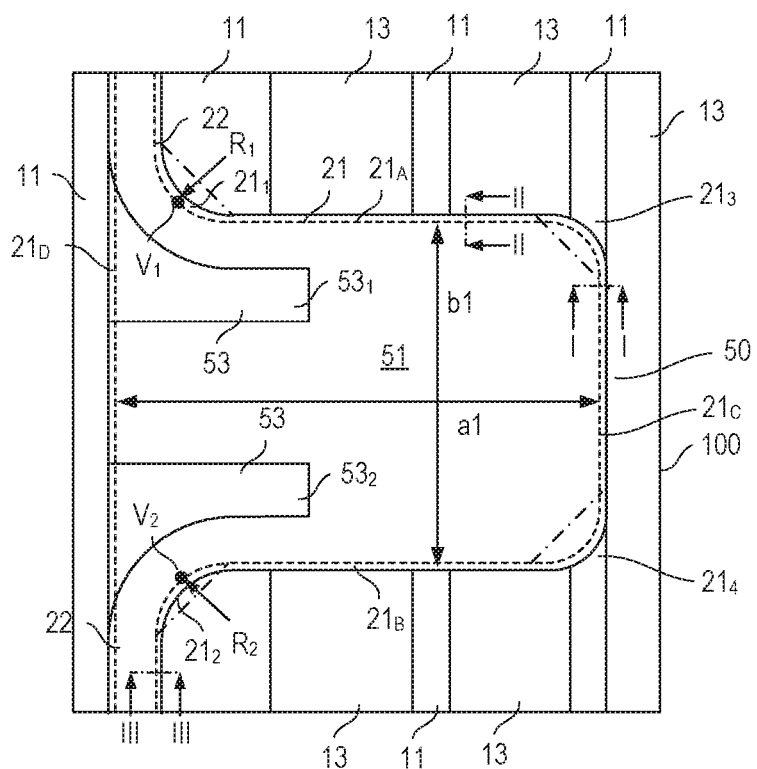
FIGS. 6A and 6B show one example of a discharging region arranged below the gate conductor.
Figure 6B:
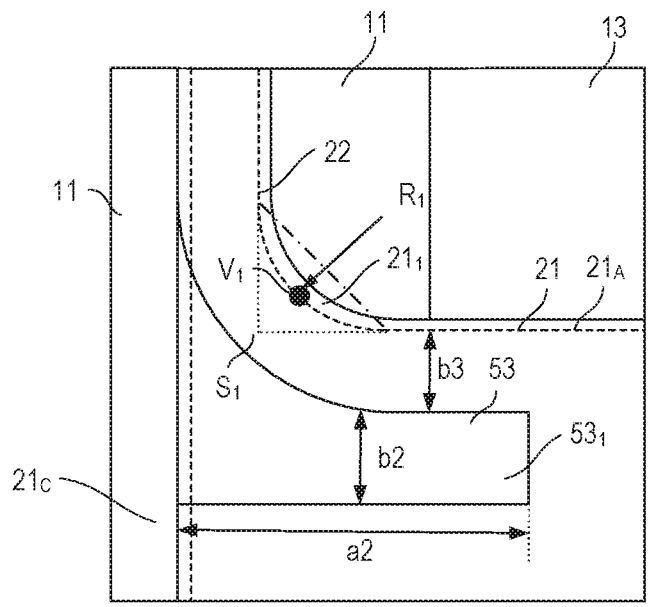

FIG. 4B shows a horizontal cross-sectional view of the transistor cells shown in FIG. 4A in a second horizontal section plane that cuts through the gate electrodes 15 of the transistor cells. Referring to FIG. 4B, the gate electrodes 15 can be formed by a plurality of elongated electrodes that are essentially parallel to each other and that are connected to the gate conductor at their respective lateral ends. The latter is illustrated in FIGS. 6A-B and explained below.

Figure 4C:
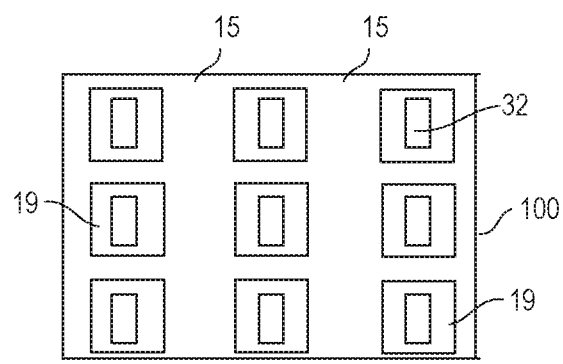
FIG. 4C shows a modification of the example shown in FIG. 4B.

According to another example illustrated in FIG. 4C, the gate electrodes 15 of the transistor cells are formed by a grid shaped electrode. The vias 32 of the source electrode extend through openings of this grid shaped electrode.

Figure 5:
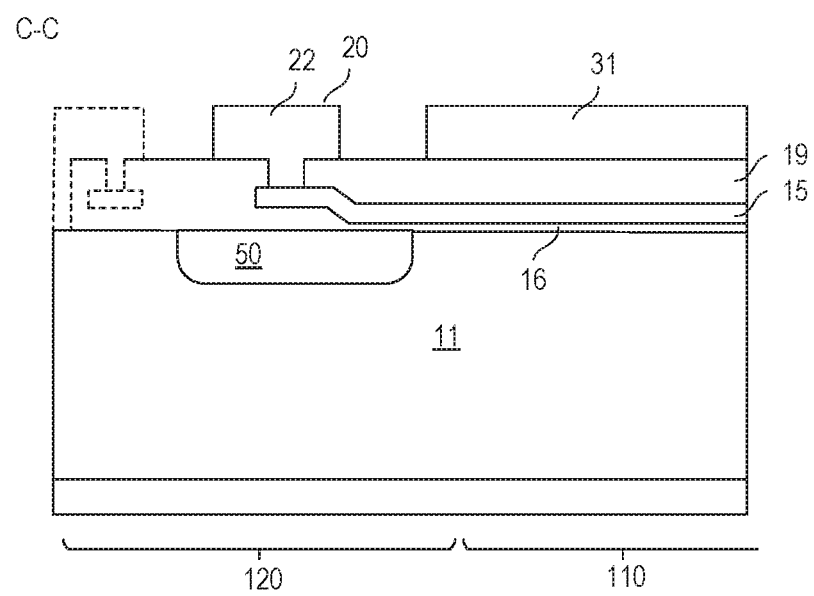
FIG. 5 illustrates a vertical cross-sectional view of one of the transistor devices shown in FIGS. 1 and 2 at a further position.

FIG. 5 shows one example of a vertical cross sectional view in a section plane C-C shown in FIGS. 1 and 2 and illustrates how the gate electrodes 15 illustrated in FIGS. 4B and 4C can be connected to the gate conductor 20 at longitudinal ends of a transistor cell 10. Section plane C-C cuts through a section of a drift region 11, so that the source region 14 and the body region 13 of the transistor cell 10 are out of view in FIG. 5. Referring to FIG. 5, longitudinal ends of the electrode(s) forming the gate electrodes 15 of the transistor cells 10 are those ends that extend beyond longitudinal ends of the transistor cells (wherein in FIG. 5 only a drift region of a transistor cell is shown).

In the examples explained above, the gate electrodes 15 are planar gate electrodes that are arranged on top of the first surface 101 of the semiconductor body 100. This, however, is only an example. According to another example (not illustrated), the gate electrodes are trench gate electrodes that are arranged in trenches extending from the first surface 101 into the semiconductor body 100. Such trench gate electrodes can be elongated and can connected to the gate conductor 20 at their respective longitudinal ends in the same way as the planar gate electrodes explained above.

The transistor device can be an n-type transistor device or a p-type transistor device. In an n-type transistor device, the source regions 14, the drift regions 11, and the drain region 17 are n-type semiconductor regions and the body regions 13 and the compensation regions 12 are p-type semiconductor regions. In a p-type transistor device the doping types of the individual active device regions are complementary to the doping type of corresponding device regions in an n-type transistor device.

Referring to FIGS. 3A and 3B, the inactive region 120 below the gate conductor 20 is devoid of transistor cells. More specifically, the inactive region 120 is devoid of source and body regions 14, 13, but may include drift and compensation regions 11, 12 and the drain region 17.

The transistor device can be operated in a first gate controlled operating mode, which is also referred to as gate controlled on-state in the following, a second gate controlled operating mode, which is also referred to as gate controlled off-state in the following, or a diode mode, which may also be referred to as bipolar conducting state. (a) In the gate controlled on-state, a voltage is applied between the drain node D and the source node S that reverse biases pn-junctions between the body regions 13 and the drift regions 11. Further, the gate electrode 15 of each transistor cell 10, by applying a suitable voltage (gate-source voltage) between the gate node G and the source node S, is driven such that there is a conducting channel in the body region 13 between the source region 14 and the drift region 11, so that a current can flow between the drain node D and the source node S. (b) In the off-state, drain-source voltage has the same polarity as in the gate-controlled on-state and the gate electrode 15 is driven such that the conducting channel in the body region 13 between the source region 14 and the drift region 11 is interrupted, so that the transistor device blocks. (c) In the diode mode, a polarity of the drain-source voltage is reversed as compared to the gate-controlled on-state and the off-state, so that, the pn-junctions between the body regions 13 and the drift regions 11 are forward biased.

In the diode mode, the drain region 17 injects charge carriers of the first conductivity and the body regions 13 (and the optional compensation regions 15) inject charge carriers of the second conductivity type into the drift regions 11, wherein these charge carriers form a charge carrier plasma in the active region 110 as well as in the inactive region 120 of the semiconductor body. In an n-type transistor device, for example, majority charge carriers are electrons and minority charge carriers are holes.

When the transistor device changes from the bipolar conducting state to the off-state these charge carriers have to be removed from the drift regions 11 before the transistor is capable of blocking a voltage between drain node D and the source node S. In a transient phase from the bipolar conducting state to the off-state, the charge carriers of the first conductivity type, in the active region 110 and in the inactive region 120, flow to the drain region 17. In the active region 110, the charge carriers of the second conductivity type flow to the source conductor 31 via the body regions 13. Referring to the above, the inactive region 120 is devoid of body regions 13. Thus, in the inactive region 120, second type charge carriers tend to flow towards the first surface 101 of the semiconductor body 100 and, in a lateral direction of the semiconductor body 100, to the active region 110. More specifically, second type charge carriers from the inactive region 120 flow along the first surface 101 to body regions 13 located at a border between the active region 110 and the inactive region 120.

In order to support the flow of second type charge carriers from a region below the first surface 101 of the inactive region 120 to body regions 13 in the active region 110 the transistor device includes a doped region 50 of the second doping type in the inactive region 120 below the gate conductor 20. This region 50, which supports "discharging" the inactive region 120 in the transient phase between the diode mode and the off-state, is also referred to as discharging region 50 in the following. According to one example, the discharging region 50 adjoins the first surface 101 of the semiconductor body 100. Further, in lateral directions, the discharging region 50 may extend beyond the gate conductor 20. According to one example, the discharging region 50 adjoins body regions 13 of transistor cells that are arranged in an edge region of the active region 110, that is, at a border between the active region 110 and the inactive region 120.

One example of a discharging region 50 is illustrated in FIGS. 6A and 6B, wherein FIG. 6B shows an enlarged detail of the discharging region shown in FIG. 6A. More specifically, FIG. 6A shows a horizontal cross-sectional view of one section of the semiconductor body 100 in a region below the gate pad 21. The position of the gate pad 21 and adjoining sections of the gate ring 22 are illustrated in dashed lines in FIGS. 6A and 6B. The discharging region 50 can be formed by an implantation process before forming the insulation layer 19, the gate conductor 20 and the source conductor 31 on top of the first surface 102 of the semiconductor body. According to one example, the discharging region 50 is a p-type region and, specifically, Boron (B) atoms may be implanted in order to form the discharging region.

The discharging region 50 supports the flow of second type charge carriers from the inactive region 120 to the active region 110 and, therefore, reduces a time period between a first time instance when the drain-source voltage at the end of the diode mode is reversed and a time instance when the charge carriers of the charge carrier plasma have completely been removed from the semiconductor body 100 so that the transistor device blocks. On the other hand, high current densities may occur in the discharging region 50 in the transient phase between the conducting state and the off-state of the transistor device. Simulations and experiments have revealed that the current density can be particularly high in those regions in which a border between the active region 110 and the inactive region 120 is curved, that is, below corners of the gate conductor 20. In the example illustrated in FIG. 6A, the gate conductor 20, in the region of the gate pad 21, includes four corners, a first corner $21_1$ between a first side $21_A$ of the gate pad 21 and an inner side of the gate ring 22, a second corner $21_2$ between a second side $21_B$ of the gate pad 21 and an inner side of the gate ring 22, a third corner $21_3$ between the first side $21_A$ and a third side $21_C$ of the gate pad 21, and a fourth corner $21_4$ between the third side $21_C$ and the second side $21_B$ of the gate pad 21. Further, in this example, the second side $21_B$ of the gate pad 21 is opposite the first side $21_A$ of the gate pad 21 and the third side $21_C$ is essentially perpendicular to the first and second side $21_A$, $21_B$. A fourth side $21_D$ of the gate pad is aligned with an outer side of the gate ring 22. The inner side of the gate ring 22 is a side facing the inner region 120 of the semiconductor body 100, and the outer side faces the edge of the semiconductor body 100.

In this example, in which the gate pad 21 is spaced apart from corners of the semiconductor body 100 in the way explained with reference to FIG. 1, each of the first and second corner $21_1$, $21_2$ is formed between a respective side of the gate pad 21 and a respective inner side of the gate ring 22, and each of the third and fourth corner $21_3$, $21_4$ is formed between two respective sides of the gate pad. This, however, is only an example. When, for example, the gate pad 21 is arranged close to a corner of the semiconductor body 100, as illustrated in FIG. 2, a first corner may be formed between a first side of the gate pad 21 and the gate runner 22, a second corner may be formed between a second side of the gate pad and the gate runner 22, and a third corner may be formed between the first side and the second side of the gate pad 21. (The first. second and third corner and the first and second sides of the gate pad are different from the first, second and third corner and the first and second sides illustrated in FIGS. 6A-B).

In the example shown in FIG. 6A, the inner and outer side of the gate ring 22 and the four sides $21_A$-$21_B$ of the gate pad 21 are essentially elongated (straight) sections. A "corner" is transition section from one of these sides to another one of these sides. The corners $21_1$-$21_4$ explained above may be implemented in various ways. According to one example, one or more of the corners are curved sections each having a radius different from zero (wherein the radius of curve $21_1$ is labelled with $R_1$ and the radius of curve $21_2$ is labelled with $R_2$ in FIG. 6A). According to one example, the radius is selected from between 1 micrometer (μm) and 200 micrometers, in particular from between 1 micrometer and 100 micrometer. These curved sections may be approximated by two or more straight sections. According to another example illustrated by dashed-and-dotted lines in FIG. 6A, one or more of the corners include a straight section extending from one side of the gate pad 21 or gate ring to another side of the gate pad 21 or gate ring 22.

In order to avoid unduly high current densities in the discharging region 50 that may cause an avalanche breakdown, the discharging region 50 includes at least one lower dose section 53 in which a doping dose is lower than a minimum doping dose in other sections 51 of the discharging region 50. These other sections 51 are referred to as basic dose sections in the following. The at least one lower dose section 53 is associated with a respective corner of the gate conductor 20. According to one example, "associated with a respective corner of the gate conductor 20" includes that a shortest distance between the at least one lower dose section 53 and a projection of a vertex of the respective corner onto the semiconductor body 100 is less than 150 micrometers, less than 100 micrometers, less than 50 micrometers, or even less than 10 micrometers.

In the example shown in FIGS. 6A-B, a first lower dose section $53_1$ is associated with the first corner $21_1$ and a second lower dose section $53_2$ is associated with the second corner $21_2$ of the gate pad 21. In FIGS. 6A-B, $R_1$ denotes the radius and $V_1$ denotes the vertex of the first corner $21_1$, and $R_2$ denotes the radius and $V_2$ denotes the vertex of the second corner 212. In this example, the lower dose sections $53_1$, $53_2$ are not located directly below the vertices $V_1$, $V_2$ of the first and second corners $21_1$, $21_2$ but are spaced apart from the vertices and located below the gate pad 21.

Referring to the above, the inner sides of the gate ring 22 and the sides $21_A$-$21_D$ of the gate pad are straight sections. In each case, two of these sides adjoining one corner have an intersection point, which is a point in which prolongations of these sides intersect. This is illustrated in FIG. 6B, in which dotted lines illustrate prolongations of the inner side of the gate ring 22 and the first side $21_A$ of the gate pad 21 and $S_1$ is the corresponding intersection point. Referring to the above, the at least one lower dose section 53 is associated with a respective corner of the gate conductor 20. According to one example, "associated with a respective corner of the gate conductor 20" includes that a shortest distance between the at least one lower dose section 53 and the intersection point (wherein in FIGS. 6A and 6B only one intersection point is illustrated) is less than 150 micrometers, less than 100 micrometers, less than 50 micrometers, or even less than 10 micrometers.

Referring to FIGS. 6A and 6B, the at least one lower dose section $53_1$, $53_2$ is spaced apart from a projection of an edge of the gate pad 21 onto the semiconductor body 100, wherein the edge of the gate pad 21 forms the sides $21_A$-$21_B$ and the corners $21_1$-$21_4$ of the gate pad 21 and is illustrated by the dashed line in FIGS. 6A and 6B. According to one example, a distance b3 between the at least one lower dose section $53_1$, $53_2$ and the edge of the gate pad is between 5 micrometers and 150 micrometers. This distance b3 may essentially be the same at each position of the at least one lower dose section $53_1$, $53_2$ or may vary.

According to one example, the size of the least one lower dose section 53 (wherein 53 denotes an arbitrary one of the lower dose sections $53_1$-$53_4$ of the discharging region 50) is between 2% and 20% of a size of the gate pad section 21. Referring to FIG. 6A, the gate pad 21 has first dimension a1 in a first lateral direction and a second dimension b1 in a second lateral direction perpendicular to the first lateral direction. In the example illustrated in FIG. 6A, the first direction is parallel to the first and second sides $21_A$, $21_B$ of the gate pad, and the second direction is parallel to the third and fourth sides $21_C$, $21_D$ of the gate pad 21. According to one example, the first dimension a1 is selected from between 200 micrometers and 400 micrometers and the second dimension b1 is selected from between 300 micrometers and 600 micrometers.

According to one example, a dimension a2 of the at least one lower dose section $53_1$, $53_2$ in the first lateral direction is between 5% and 50% of the dimension a1 gate pad 21 in this direction, that is 0.05·a1<a2<0.5·a1. According to one example, a dimension b2 of the at least one lower dose section $53_1$, $53_2$ in the second lateral direction is between 5 micrometers and 150 micrometers or is between 1% and 50%, in particular between 1% and 40%, of the dimension b1 of the gate pad 21 in this direction. Referring to FIGS. 6A and 6B, the dimension of the at least one lower dose section $53_1$ may vary in the first lateral direction and the second lateral direction. In this case, either (a) a2 denotes the average dimension of the at least one lower dose section $53_1$ in the first lateral direction, and b2 denotes the average dimension of the at least one lower dose section $53_1$ in the second lateral direction at the narrowest position, or (b) a2 denotes the dimension of the at least one lower dose section $53_1$ in the first lateral direction at the widest position, and b2 denotes the dimension of the at least one lower dose section $53_1$ in the second lateral direction at the narrowest position.

Figure 7:
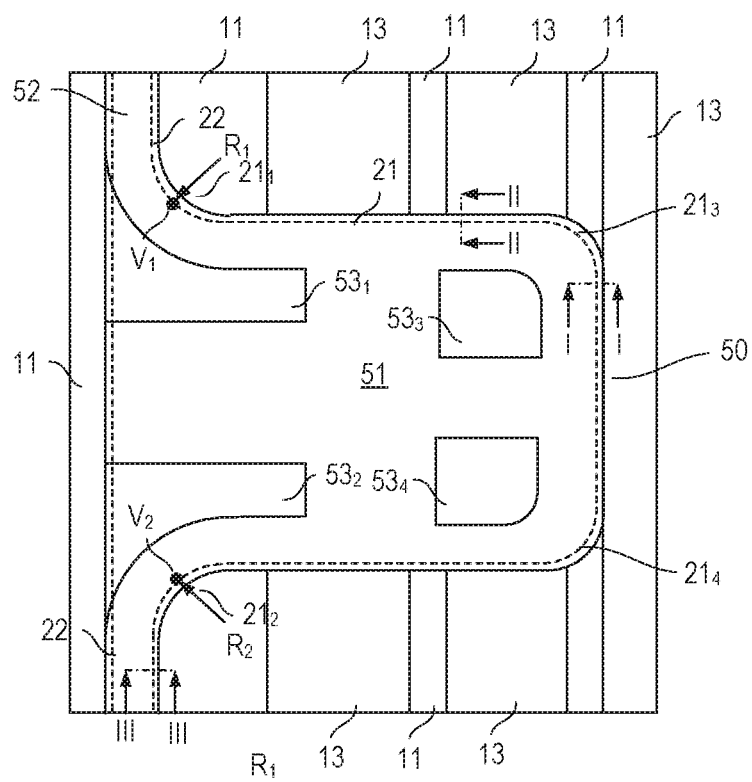
FIG. 7 shows another example of the discharging region.

According to another example, illustrated in FIG. 7, further lower dose sections $53_3$, $53_4$ may be arranged below the gate conductor 20 in regions of the third corner $21_3$ and the fourth corner $21_4$. In this example, these further lower dose sections are not located directly below vertices of the third and fourth corners $21_3$, $21_4$ but are spaced apart from the vertices and located below the gate pad 21.

According to one example, a doping dose (of dopant atoms of the second doping type) of the lower dose section 53 is lower than 1% of a doping dose in the basic dose sections 51. According to another example, the at least one lower dose section 53 is shielded in the implantation process that forms the discharging region 50, so that no dopant atoms of the second doping type are implanted into the at least one lower dose section 53. According to one example, the minimum doping dose in the basic dose sections 51 of the discharging region 50 is selected from between 2E12 cm$^{-2}$ and 2E14 cm$^{-2}$.

Figure 8A:
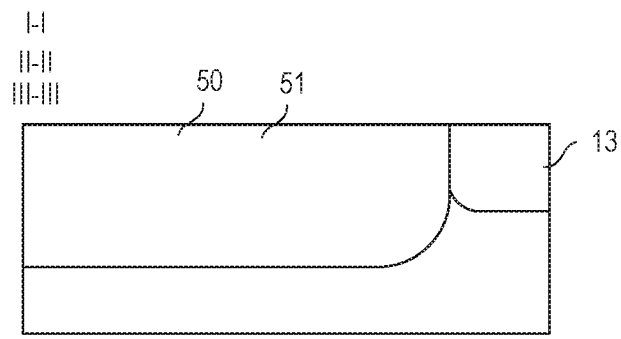
FIGS. 8A and 8B illustrate a vertical cross-sectional view and one example of a doping profile of the discharging region.
Figure 8B:
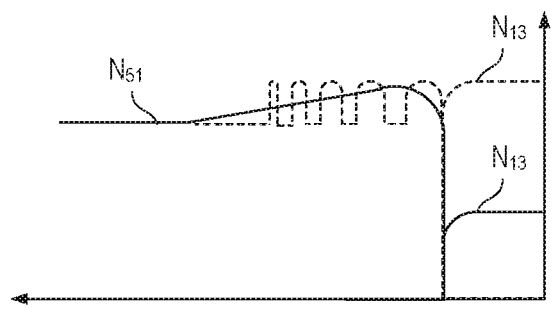

According to one example, the basic dose sections 51, that is, sections outside the lower dose sections 53 of the discharging region 50 may have an essentially homogeneous doping dose. According to another example, the doping dose increases towards the active region 110. The latter is schematically illustrated in FIGS. 8A and 8B which show a vertical cross sectional view of one of the basic dose sections 51 of the discharging region 50 (FIG. 8A) and the doping profile (FIG. 8B) of the discharging region 50 in one of sections I-I, II-II, or III-III, illustrated in FIGS. 6A-B and 7. More specifically, FIG. 8B illustrates the doping dose $N_{51}$ of one of the basic dose sections 51 of the discharging region 50 and the doping dose $N_{13}$ of the adjoining body region 13. The doping dose $N_{13}$ of the body region 13 may be lower than the doping dose of the basic dose sections 51 of the discharging region or may essentially be the same as the doping dose of the basic dose sections 51 of the discharging region 50.

The doping dose may increase, as illustrated by the solid line in FIGS. 8A-B. Alternatively, the discharging region 50 includes two or more sections with an increased doping dose towards the active region. A resulting doping profile is illustrated in dashed lines in FIGS. 8A-B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a plurality of transistor cells each comprising a source region of a first doping type, a body region of a second doping type, and a drift region of the first doping type in a first region of a semiconductor body, and a gate electrode that is dielectrically insulated from the body region by a gate dielectric;
a gate conductor arranged on top of a second region of the semiconductor body and electrically connected to the gate electrode of each of the plurality of transistor cells;
a source conductor arranged on top of the first region of the semiconductor body and connected to the source region and the body region of each of the plurality of transistor cells; and
a discharging region of the second doping type arranged in the semiconductor body in the second region and located at least partially below the gate conductor,
wherein the discharging region comprises at least one lower dose section in which a doping dose is lower than a minimum doping dose in other sections of the discharging region,
wherein the at least one lower dose section is associated with a corner of the gate conductor.

2. The transistor device of claim 1, wherein a shortest distance between a vertex of the corner and the at least one lower dose section is less than 150 micrometers.

3. The transistor device of claim 1, wherein a shortest distance between an intersection point of prolongations of two sides forming a respective corner and the at least one lower dose section is less than 150 micrometers.

4. The transistor device of claim 1, wherein the gate conductor comprises a gate pad section and a gate ring section, wherein the gate ring section adjoins the gate pad section, and wherein the corner of the gate conductor is a section where the gate ring section adjoins the gate pad section and/or a corner of the gate pad section.

5. The transistor device of claim 1, wherein the discharging region adjoins the body region of at least one of the plurality of transistor cells.

6. The transistor device of claim 5, wherein the discharging region extends deeper into the semiconductor body from a first surface than the body regions of the plurality of transistor cells.

7. The transistor device of claim 1, wherein the doping dose of the at least one lower dose section is less than 10% of a minimum doping dose of other sections of the discharging region.

8. The transistor device of claim 1, wherein a size of the at least one lower dose section is between 2% and 10% of a size of a gate pad section of the gate conductor.

9. The transistor device of claim 1, wherein a first dimension of the at least one lower dose section is between 5% and 50% of a first dimension of a gate pad section of the gate conductor in a same first direction.

10. The transistor device of claim 9, wherein a second dimension of the at least one lower dose section in a second direction perpendicular to the first direction is between 5 micrometers and 150 micrometers.

11. The transistor device of claim 1, wherein the at least one lower dose section comprises two or four lower dose sections.

12. The transistor device of claim 1, wherein the at least one lower dose section is separated from the first region by one of the other sections of the discharging region.

13. The transistor device of claim 12, wherein the one of the other sections of the discharging region has an essentially homogenous doping dose.

14. The transistor device of claim 12, wherein the one of the other sections of the discharging region has a doping dose that increases towards the body region.

15. The transistor device of claim 1, wherein a doping dose of the other sections of the discharging region is in a range between $2E12$ $cm^{-2}$ and $2E14$ $cm^{-2}$.

* * * * *